(12) United States Patent
Park et al.

(10) Patent No.: US 12,046,526 B2
(45) Date of Patent: Jul. 23, 2024

(54) METHODS OF FABRICATING SEMICONDUCTOR PACKAGE

(71) Applicant: Samsung Electronics Co., Ltd., Suwon-si (KR)

(72) Inventors: Jung-Ho Park, Cheonan-si (KR); Jin-Woo Park, Seoul (KR); Jae Gwon Jang, Hwaseong-si (KR); Gwang Jae Jeon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/735,471

(22) Filed: May 3, 2022

(65) Prior Publication Data

US 2022/0262696 A1 Aug. 18, 2022

Related U.S. Application Data

(63) Continuation of application No. 16/866,594, filed on May 5, 2020, now Pat. No. 11,328,970.

(30) Foreign Application Priority Data

Aug. 30, 2019 (KR) .................. 10-2019-0107487

(51) Int. Cl.
*H01L 23/31* (2006.01)
*H01L 21/56* (2006.01)
(Continued)

(52) U.S. Cl.
CPC ........ *H01L 23/3128* (2013.01); *H01L 21/565* (2013.01); *H01L 24/19* (2013.01); *H01L 23/293* (2013.01)

(58) Field of Classification Search
None
See application file for complete search history.

(56) References Cited

U.S. PATENT DOCUMENTS 9,263,373 B2 2/2016 Hu
9,455,219 B2 9/2016 Shimizu et al.
(Continued)

FOREIGN PATENT DOCUMENTS

KR 101323925 B1 10/2013

*Primary Examiner* — Jay C Chang
(74) *Attorney, Agent, or Firm* — Myers Bigel, P.A.

(57) ABSTRACT

Methods of fabricating a semiconductor package may include forming a first barrier layer on a first carrier, forming a sacrificial layer, including an opening that exposes at least a portion of the first barrier layer, on the first barrier layer, and forming a second barrier layer on the first barrier layer and on the sacrificial layer. The second barrier layer may include a portion formed on the sacrificial layer. The methods may also include forming a first insulating layer in the opening and protruding beyond a top surface of the portion of the second barrier layer on the sacrificial layer, a top surface of the first insulating layer being farther from the first barrier layer than the top surface of the portion of the second barrier layer, forming a redistribution structure including a redistribution layer and a second insulating layer on the first insulating layer and on the second barrier layer, mounting a semiconductor chip on the redistribution structure, attaching a second carrier onto the semiconductor chip and removing the first carrier, removing the first barrier layer, the sacrificial layer, and the second barrier layer to expose portions of the redistribution structure, and forming solder balls, respectively, on the portions of the redistribution structure.

16 Claims, 18 Drawing Sheets

(51) Int. Cl.
    *H01L 23/00*     (2006.01)
    *H01L 23/29*     (2006.01)

(56) References Cited

U.S. PATENT DOCUMENTS

| | | | |
|---|---|---|---|
| 10,192,816 | B2 | 1/2019 | Kelly et al. |
| 10,276,536 | B2 | 4/2019 | Pei et al. |
| 2008/0224308 | A1* | 9/2008 | Lee .......................... H01L 24/81 |
| | | | 257/737 |
| 2008/0257596 | A1* | 10/2008 | Kaneko ................ H05K 3/4682 |
| | | | 257/E21.511 |
| 2016/0225669 | A1* | 8/2016 | Choi ........................ H01L 24/19 |
| 2017/0200686 | A1* | 7/2017 | Kang .................. H01L 23/3171 |
| 2018/0061805 | A1 | 3/2018 | Fang et al. |
| 2018/0082970 | A1 | 3/2018 | Chen et al. |
| 2018/0122732 | A1 | 5/2018 | Kuo et al. |
| 2018/0308800 | A1* | 10/2018 | Tsai .................... H01L 21/4853 |
| 2019/0198478 | A1* | 6/2019 | Keser ...................... H01L 24/92 |
| 2019/0267314 | A1* | 8/2019 | Lee ...................... H01L 25/117 |
| 2020/0075496 | A1* | 3/2020 | Yu .......................... H01L 24/32 |

\* cited by examiner

METHODS OF FABRICATING SEMICONDUCTOR PACKAGE

CROSS-REFERENCE TO RELATED APPLICATION

This application is a continuation of U.S. patent application Ser. No. 16/866,594, filed May 5, 2020, which application claims priority under 35 U.S.C. § 119 to Korean Patent Application No. 10-2019-0107487, filed on Aug. 30, 2019 in the Korean Intellectual Property Office, the disclosure of which is incorporated by reference herein in its entirety.

FIELD

The present disclosure relates to a method of fabricating a semiconductor package.

BACKGROUND

Recently, as high-performance devices are increasingly being preferred, not only the size of semiconductor chips, but also the size of semiconductor packages, is increasing accordingly. In contrast, as electronic devices become slimmer, the thickness of semiconductor packages has decreased.

Semiconductor packaging is a process of packaging a semiconductor chip so as to electrically connect the semiconductor chip (or a semiconductor die) and an electronic device. As the size of semiconductor chips has decreased, fan-out wafer-level packaging (FOWLP) has been suggested in which input and output terminals of a semiconductor package are disposed on the outside of a semiconductor chip via a redistribution layer. Since FOWLP is simple and can be used to form thin semiconductor packages, FOWLP may be suitable for the miniaturization and the thinning of semiconductor packages and may provide improved thermal and electrical characteristics.

SUMMARY

Embodiments of the present inventive concept provide semiconductor packages with improved product reliability.

Embodiments of the present inventive concept also provide methods of fabricating a semiconductor package with improved product reliability.

According to some embodiments of the present inventive concept, methods of fabricating a semiconductor package may include forming a first barrier layer on a first carrier; forming a sacrificial layer, including an opening that exposes at least a portion of the first barrier layer, on the first barrier layer; forming a second barrier layer on the first barrier layer and on the sacrificial layer, the second barrier layer including a portion formed on the sacrificial layer; forming a first insulating layer in the opening and protruding beyond a top surface of the portion of the second barrier layer, a top surface of the first insulating layer being farther from the first barrier layer than the top surface of the portion of the second barrier layer; forming a redistribution structure including a redistribution layer and a second insulating layer on the first insulating layer and on the second barrier layer; mounting a semiconductor chip on the redistribution structure; attaching a second carrier onto the semiconductor chip and removing the first carrier; removing the first barrier layer, the sacrificial layer, and the second barrier layer to expose portions of the redistribution structure; and forming solder balls, respectively, on the portions of the redistribution structure.

According to some embodiments of the present inventive concept, methods of fabricating a semiconductor package may include sequentially forming a release layer and a first barrier layer on a first carrier; forming a sacrificial layer, including a metallic material and an opening that exposes at least a portion of the first barrier layer, on the first barrier layer; forming a second barrier layer extending on the first barrier layer and on the sacrificial layer; forming a first insulating layer that is thicker than the sacrificial layer, in the opening; forming a redistribution structure including a redistribution layer and a second insulating layer on the first insulating layer and on the second barrier layer; mounting a semiconductor chip on the redistribution structure; attaching a second carrier onto the semiconductor chip and removing the first carrier and the release layer; removing the first barrier layer, the sacrificial layer, and the second barrier layer to expose portions of the redistribution layer; and forming solder balls, respectively, on the portions of the redistribution layer.

According to some embodiments of the present inventive concept, methods of fabricating a semiconductor package may include sequentially forming a release layer and a first barrier layer on a first carrier; forming a sacrificial layer including an opening that exposes at least a portion of the first barrier layer, on the first barrier layer; forming a second barrier layer conformally on the first barrier layer and on the sacrificial layer; forming a first insulating layer in the opening, a top surface of the first insulating layer being farther from the first barrier layer than a top surface of a portion of the second barrier layer formed on the sacrificial layer; forming a redistribution structure including a redistribution layer and a second insulating layer that is stacked on the redistribution layer to surround the redistribution layer, on the first insulating layer and on the second barrier layer; mounting a semiconductor chip on the redistribution structure; attaching a second carrier onto the semiconductor chip and removing the first carrier; removing the release layer; sequentially removing the first barrier layer, the sacrificial layer, and the second barrier layer; and forming a solder ball in a space from which the sacrificial layer has been removed, the solder ball being electrically connected to the redistribution layer.

The present inventive concept is not limited to example embodiments provided herein. The above and other embodiments of the present inventive concept will become more apparent to one of ordinary skill in the art to which the present inventive concept pertains by referencing the detailed description described herein with reference to the drawings.

BRIEF DESCRIPTION OF THE DRAWINGS

Example embodiments and features of the present inventive concept will become more apparent by descriptions provided herein with reference to the attached drawings, in which.

DETAILED DESCRIPTION

Figure 1:
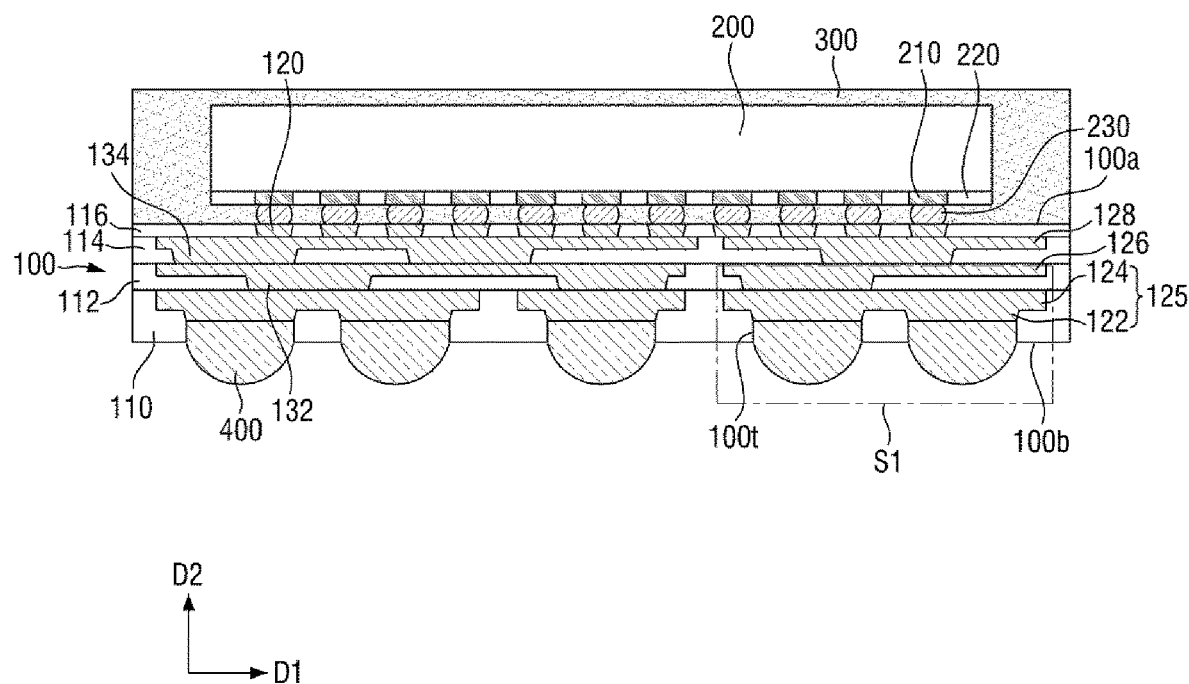
FIG. 1 is a cross-sectional view of a semiconductor package according to some embodiments of the present inventive concept.

FIG. 1 is a cross-sectional view of a semiconductor package according to some embodiments of the present inventive concept.

Referring to FIG. 1, the semiconductor package according to some embodiments of the present inventive concept may include a redistribution structure 100, a semiconductor chip 200, a molding part 300, and solder balls 400.

The redistribution structure 100 may include first and second surfaces 100a and 100b, which are opposite each other. For example, the first surface 100a may be the top surface of the redistribution structure 100, and the second surface 100b may be the bottom surface of the redistribution structure 100.

The redistribution structure 100 may include a plurality of redistribution layers (120, 125, 126, and 128), a plurality of insulating layers (110, 112, 114, and 116), and a plurality of vias (132 and 134).

The redistribution layers (120, 125, 126, and 128) may extend in a first direction D1. Each of the redistribution layers (120, 125, 126, and 128) may include multiple redistribution layers that are spaced apart from one another in the first direction D1.

The redistribution layers (120, 125, 126, and 128) may be sequentially stacked from the second surface 100b to the first surface 100a. That is, the redistribution layers (120, 125, 126, and 128) may be spaced apart from one another in a second direction D2 and may be disposed at different levels in the second direction D2. Here, the second direction D2 may be a direction perpendicular to the first direction D1.

The redistribution layers (120, 125, 126, and 128) may be electrically connected via a plurality of vias (132 and 134). The number of redistribution layers (120, 125, 126, and 128) and the locations and the arrangement of the redistribution layers (120, 125, 126, and 128) are not limited to those shown in FIG. 1 and may be different from those shown in FIG. 1.

The redistribution layers (120, 125, 126, and 128) may be at least partially exposed through trenches 100t. For example, a first redistribution layer 125 may be at least partially exposed through the trenches 100t. The first redistribution layer 125 may include electrode pads 122 and a sub-redistribution layer 124, and this will be described later with reference to FIG. 2. In some embodiments, at least portion of the redistribution layers (120, 125, 126, and 128) may contact an insulating layer (e.g., 110) in the trench 100t as illustrated in FIG. 1.

The redistribution layers (120, 125, 126, and 128) may include, for example, copper (Cu), but the present inventive concept is not limited thereto. Also, the redistribution layers (120, 125, 126, and 128) may include at least one of, for example, aluminum (Al), silver (Ag), tin (Sn), gold (Au), nickel (Ni), lead (Pb), titanium (Ti), and an alloy thereof.

The vias (132 and 134) may connect the redistribution layers (120, 125, 126, and 128), which are formed in different levels, to one another. For example, a first via 132 may connect the first redistribution layer 125 and a second redistribution layer 126 through a second insulating layer 112, and a second via 134 may connect second and third redistribution layers 125 and 126 through a third insulating layer 114. The number of vias (132 and 134) and the locations and the arrangement of the vias (132 and 134) are not limited to those shown in FIG. 1 and may be different from those shown in FIG. 1.

The vias (132 and 134) may include a conductive material. Accordingly, an electrical path that connects the first and second surfaces 100a and 100b may be formed in the redistribution structure 100. For example, the vias (132 and 134) may include the same material as the redistribution layers (120, 125, 126, and 128). The vias (132 and 134) may include, for example, Cu. Also, the vias (132 and 134) may include at least one of, for example, Al, Ag, Sn, Au, Ni, Pb, Ti, and an alloy thereof.

The insulating layers (110, 112, 114, and 116) may surround the redistribution layers (120, 125, 126, and 128) and the vias (132 and 134).

The insulating layers (110, 112, 114, and 116) may include the same material. The insulating layers (110, 112, 114, and 116) may include, for example, a photo-imageable dielectric (PID) material. The insulating layers (110, 112, 114, and 116) may include, for example, epoxy or polyimide. Accordingly, the insulating layers (110, 112, 114, and 116) may be formed in a wafer level by photolithography. The insulating layers (110, 112, 114, and 116) may be formed to be thin, and the vias (132 and 134) may be formed to have a fine pitch.

The semiconductor chip 200 may be mounted on the first surface 100a of the redistribution structure 100. The redistribution structure 100 may include a fan-in area, which overlaps with the semiconductor chip 200, and a fan-out area, which does not overlap with the semiconductor chip 200, i.e., an area other than the fan-in area. That is, the semiconductor package according to some embodiments of the present inventive concept may be a fan-out wafer level package, but the present inventive concept is not limited thereto. In some embodiments, the semiconductor package according to some embodiments of the present inventive concept may be a wafer-level package.

The semiconductor chip 200 may be, for example, an integrated circuit (IC) in which hundreds to millions of devices are integrated. The semiconductor chip 200 may be, for example, a processor chip such as a central processing unit (CPU), a graphics processing unit (GPU), a field programmable gate array (FPGA), a digital signal processor, a cryptographic processor, or a microprocessor, particularly, a logic chip such as an application processor (AP). In some embodiments, the semiconductor chip 200 may be a volatile memory chip such as a dynamic random access memory (DRAM) or a static random access memory (SRAM) or a nonvolatile memory chip such as a phase-change random access memory (PRAM), a magneto-resistive random access memory (MRAM), a ferroelectric random access memory (FeRAM), or a resistive random access memory (RRAM). In some embodiments, the semiconductor chip 200 may be the combination of a logic chip and a memory chip, but the present inventive concept is not limited thereto.

The semiconductor chip 200 may include connection pads 210, a passivation layer 220, and bumps 230.

The connection pads 210 may electrically connect the semiconductor chip 200 and other elements. The connection pads 210 may include, for example, a conductive material such as Al.

The passivation layer 220 may at least partially expose the connection pads 210. The passivation layer 220 may be, for example, an oxide film, a nitride film, a double layer of an oxide film and a nitride film. The passivation layer 220 may include an insulating material such as a thermosetting resin (e.g., an epoxy resin), a thermoplastic resin (e.g., polyimide), or the mixture of a thermosetting or thermoplastic resin and an inorganic filler, or a resin such as prepreg, a Ajinomoto Build-up Film (ABF), FR-4, or bismaleimide triazine (BT) that is obtained by impregnating a core material such as glass fiber with an inorganic filler.

The bumps 230 may be disposed between the first surface 100a of the redistribution structure 100 and the connection pads 210. The bumps 230 may be in contact with the connection pads 210 and the redistribution layer 120. The bumps 230 may electrically connect the semiconductor chip 200 and the redistribution structure 100. The bumps 230 may include at least one of, for example, Au, Ag, Ni, Cu, Sn, and an alloy thereof, but the present inventive concept Is not limited thereto.

The molding part 300 may cover the sides and the top surface of the semiconductor chip 200. The molding part 300 may fill the gaps between the sides and the top surface of the semiconductor chip 200, the first surface 100a of the redistribution structure 100, and the bumps 230. The sides of the molding part 300 may form the same planes as the sides of the redistribution structure 100. It will be understood that "an element A covers an element B" (or similar language) means that the element A extends on the element B but does not necessarily mean that the element A covers the element B entirely. It will be also understood that "an element A fills an element B" (or similar language) as used herein means that the element A is in the element B but does not necessarily mean that the element A fills the element B entirely.

The molding part 300 may include, for example, an epoxy molding compound (EMC) or a silicone hybrid material.

The solder balls 400 may be disposed in one or more trenches 100t, which are formed on the second surface 100b of the redistribution structure 100. The solder balls 400 may be disposed on the first redistribution layer 125. Accordingly, the solder balls 400 may be electrically connected to the redistribution structure 100. Also, the semiconductor package according to some embodiments of the present inventive concept may be electrically connected to an external device via the solder balls 400. The number of solder balls 400 and the shape and the arrangement of the solder balls 400 are not limited to those shown in FIG. 1 and may be different from those shown in FIG. 1.

The solder balls 400 may include at least one of, for example, Sn, indium (In), lead (Pb), zinc (Zn), Ni, Au, Ag, Cu, antimony (Sb), bismuth (Bi), and a combination thereof, but the present inventive concept is not limited thereto.

Figure 2:
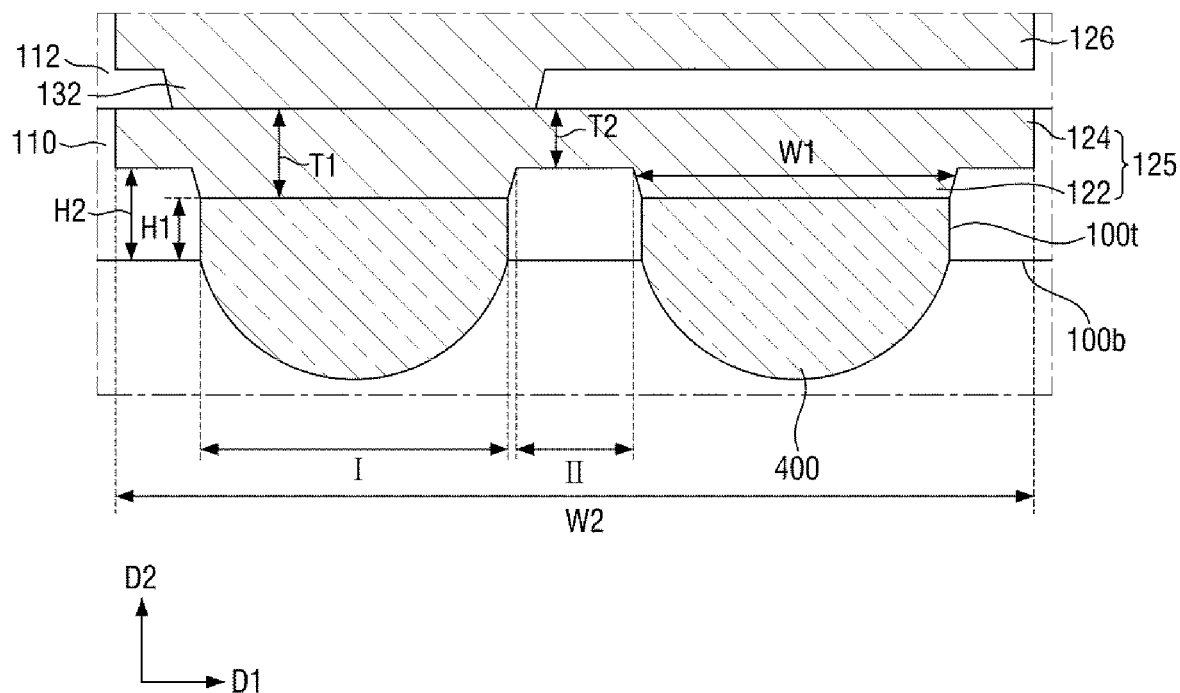
FIG. 2 is an enlarged cross-sectional view of an area Si of FIG. 1.

FIG. 2 is an enlarged cross-sectional view of an area Si of FIG. 1.

Referring to FIG. 2, the second redistribution layer 126 may be disposed on the first redistribution layer 125. The first and second redistribution layers 125 and 126 may be in contact with the first via 132.

The first redistribution layer 125 may include first portions I, which have a first thickness T1 in the second direction D2, and second portions II, which have a second thickness T2 in the second direction D2. The top surfaces, in the second direction D2, of the first portions I and the top surfaces, in the second direction D2, of the second portions II may form the same planes together. The first thickness T1 may be greater (i.e., thicker) than the second thickness T2. In some embodiments, the top surfaces of the first portion I and the second portion II face the second redistribution layer 126 and are coplanar with each other as illustrated in FIG. 2.

The first redistribution layer 125 may include the electrode pads 122 and the sub-redistribution layer 124. The first portions I may include the electrode pads 122 and the sub-redistribution layer 124, and the second portions II may include the sub-redistribution layer 124.

The electrode pads 122 may have a first height H1 from the second surface 100b, i.e., in the second direction D2. The sub-redistribution layer 124 may have a second height H2 from the second surface 100B, i.e., in the second direction D2. The second height H2 may be greater than the first height H1.

The electrode pads 122 may have a first width W1. The sub-redistribution layer 124 may have a second width W2, which is greater than the first width W1. The electrode pads 122 may be disposed in parts of the sub-redistribution layer 214 with the first width W1. In some embodiments, the electrode pad 122 may include a lower surface facing the solder ball 400, and the lower surface of the electrode pad 122 may have the first width W1 as illustrated in FIG. 2. In some embodiments, the electrode pad 122 may contact the solder ball 400, and the electrode pad 122 may have the first width W1 at or adjacent to an interface with the solder ball 400 as illustrated in FIG. 2. As used herein, the term "part" may be interchangeable with the term "portion," and "a part of an element A" (or similar language) may refer to "a portion of the element A."

The electrode pads 122 and the sub-redistribution layer 124 may have an integral structure. The term "integral structure", as used herein, may refer to a structure having parts fabricated by the same process. That is, the electrode pads 122 and the sub-redistribution layer 124 may be formed by the same process. Thus, the electrode pads 122 and the sub-redistribution layer 124 may include the same material. The electrode pads 122 and the sub-redistribution layer 124 may include, for example, Cu.

The redistribution structure 100 may include the trenches 100t, which are formed on the second surface 100b. In some embodiments, the trenches 100t may be connected to the second surface 100b as illustrated in FIG. 2.

The trenches 100t may be defined by a first insulating layer 110.

The trenches 100t may be defined by the first insulating layer 110 and the electrode pads 122. That is, the electrode pads 122 may be exposed by the trenches 100t. The electrode pads 122 may extend along parts of the sidewalls of each of the trenches 100t. That is, the electrode pads 122 may extend in the second direction D2.

The solder balls 400 may be disposed in the trenches 100t. That is, the solder balls 400 may include parts disposed in the redistribution structure 100 and parts disposed outside the redistribution structure 100. The first redistribution layer 125 and the solder balls 400 may be at least partially surrounded by the first insulating layer 110. Thus, the reliability of the bonding between the solder balls 400 and the electrode pads 122 can be improved.

Figure 3:
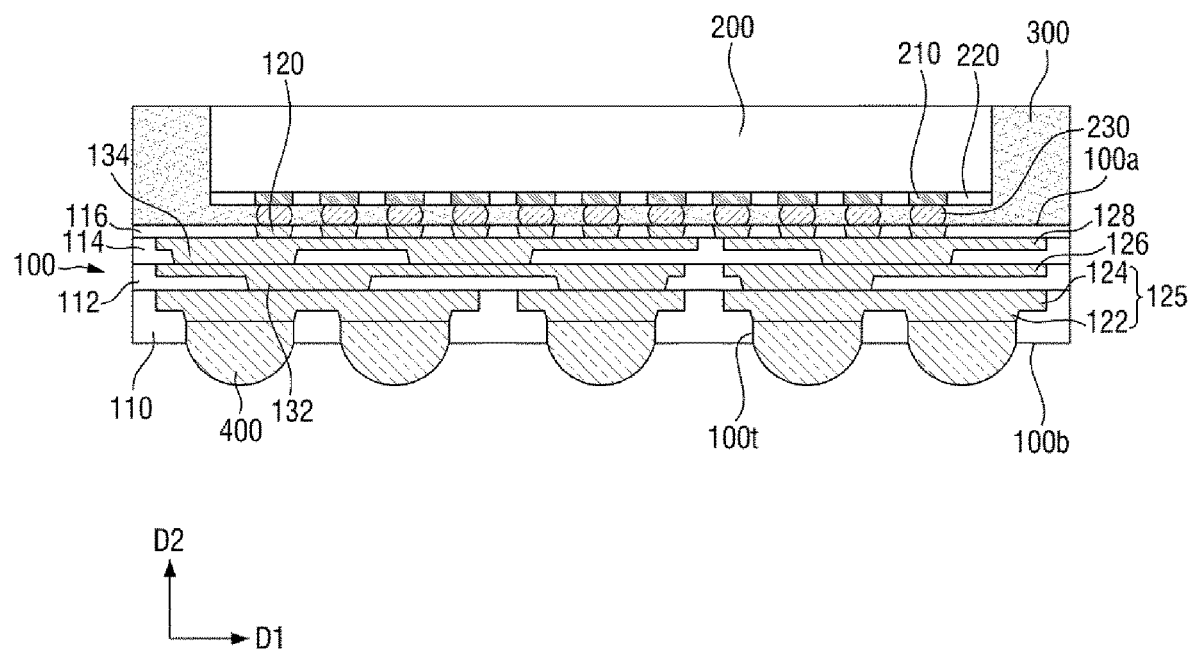
FIG. 3 is a cross-sectional view of a semiconductor package according to some embodiments of the present inventive concept.

FIG. 3 is a cross-sectional view of a semiconductor package according to some embodiments of the present inventive concept. For convenience, the semiconductor package of FIG. 3 may hereinafter be described, focusing mainly on the differences with the semiconductor package of FIG. 1.

Referring to FIG. 3, a molding part 300 may cover the sides of a semiconductor chip 200 and a first surface 100a of a redistribution structure 100. The molding part 300 may expose the top surface of the semiconductor chip 200. The top surface of the molding part 300 may be disposed on the same plane as the top surface of the semiconductor chip 200.

A heat transmitter (not illustrated) may be disposed on, for example, the top surfaces of the molding part 300 and the semiconductor chip 200. Since the semiconductor chip 200 and the heat transmitter may be in direct contact with each other, heat generated by the semiconductor chip 200 can easily be released through the heat transmitter.

The semiconductor package of FIG. 1 or 3 may be mounted on a main board. The semiconductor package of FIG. 1 or 3 may be electrically connected to a main board via the solder balls 400. Examples of the main board may include a smartphone, a personal digital assistant (PDA), a digital video camera, a digital still camera, a network system, a computer, a monitor, a tablet, a laptop computer, a netbook, a television (TV), a video gaming console, and a smartwatch.

FIGS. 4 through 16 are cross-sectional views illustrating a method of fabricating a semiconductor package according to some embodiments of the present inventive concept. A method of fabricating a semiconductor package according to some embodiments of the present inventive concept will hereinafter be described with reference to FIGS. 4 through 16.

Figure 4:
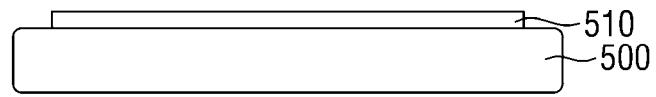
FIGS. 4 through 16 are cross-sectional views illustrating a method of fabricating a semiconductor package according to some embodiment of the present inventive concept.

Referring to FIG. 4, a release layer 510 may be formed on a first carrier 500. The first carrier 500 may include, for example, silicon, a metal, glass, plastics, or ceramics.

The release layer 510 may be formed to have a predetermined thickness. For example, the release layer 510 may be in the form of a film, but the present inventive concept is not limited thereto. The release layer 510 may be formed by deposition or coating.

The release layer 510 may include a PID material. The release layer 510 may be, for example, of a positive type that reacts upon irradiation.

For example, an adhesive layer (not illustrated) may be further formed between the first carrier 500 and the release layer 510. The adhesive layer may include, for example, a polymer-based light-to-heat conversion (LTHC) material that can be removed together with the first carrier 500. In some embodiments, the adhesive layer may include, for example, an epoxy-based heat-release material or an ultraviolet (UV) adhesive.

Figure 5:

Referring to FIG. 5, a first barrier layer 512 may be formed on the release layer 510. The first barrier layer 512 may include a metallic material. The first barrier layer 512 may include, for example, Ti.

The first barrier layer 512 may be formed by, for example, physical vapor deposition (PVD), sputtering, or chemical vapor deposition (CVD), but the present inventive concept is not limited thereto.

Figure 6:
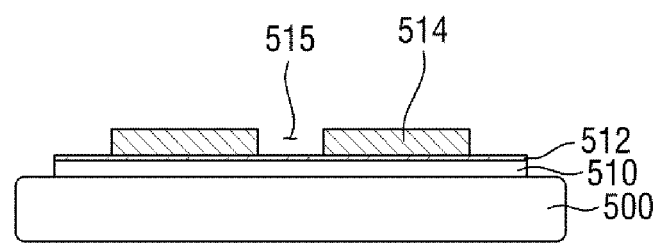

Referring to FIG. 6, a sacrificial layer 514 may be formed on the first barrier layer 512. The sacrificial layer 514 may expose a portion of the first barrier layer 512. For example, the sacrificial layer 514 may include an opening 515.

A mask pattern (not illustrated) may be formed on the first barrier layer 512. The mask pattern may be formed above the opening 515. The mask pattern may be formed by applying and patterning photoresist.

The sacrificial layer 514 may be formed on a portion of the first barrier layer 512 that is exposed. The sacrificial layer 514 may be formed by, for example, PVD, sputtering, or CVD. In some embodiments, the sacrificial layer 514 may be formed by, for example, electroplating. Once the sacrificial layer 514 is formed, the mask pattern may be removed. The opening 515 may be defined by the top surface of the portion of the first barrier layer 512 exposed by the mask pattern.

The sacrificial layer 514 may include a different metallic material from the first barrier layer 512. The sacrificial layer 514 may include, for example, Cu.

Figure 7:
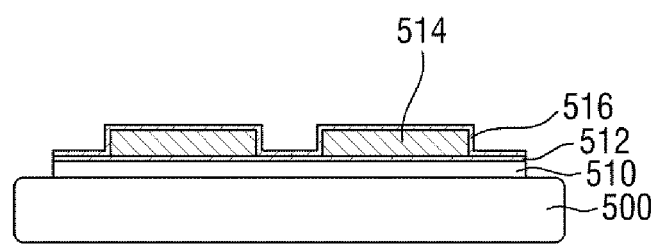

Referring to FIG. 7, a second barrier layer 516 may be formed conformally in the opening 515 and on the sacrificial layer 514. The second barrier layer 516 may cover the top surface and the sides of the sacrificial layer 514. The second barrier layer 516 may cover the top surface of the exposed portion of the first barrier layer 512. In some embodiments, the second barrier layer 516 may have a uniform thickness along a surface of the first barrier layer 512 and the sacrificial layer 514 as illustrated in FIG. 7.

The second barrier layer 516 may include a different metallic material from the sacrificial layer 514. The second barrier layer 516 may include at least one of, for example, Ti, chromium (Cr), tungsten (W), Al, palladium (Pd), Au, and a combination thereof, but the present inventive concept is not limited thereto.

The second barrier layer 516 may be formed by, for example, PVD, sputtering, or CVD, but the present inventive concept is not limited thereto.

Figure 8:
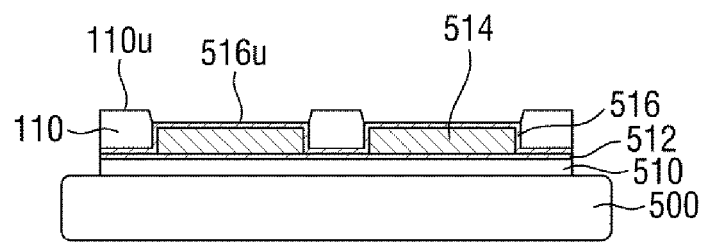

Referring to FIG. 8, a first insulating layer 110 may be formed on the second barrier layer 516. The first insulating layer 110 may expose portions of the second barrier layer 516. For example, the first insulating layer 110 may expose a top surface 516u of part of the second barrier layer 516 on the sacrificial layer 514.

The first insulating layer 110 may be thicker than the sacrificial layer 514. That is, the top surface 110u of the first insulating layer 110 may be higher than the top surface 516u of the part of the second barrier layer 516 on the sacrificial layer 514. In some embodiments, an upper portion of the first insulating layer 110 may protrude upwardly beyond the top surface 516u of the portion of the second barrier layer 516, and thus the top surface of the first insulating layer 110 may be farther from the first barrier layer 512 than the top surface 516u of the part of the second barrier layer 516 as illustrated in FIG. 8.

The first insulating layer 110 may include the same material as the release layer 510. The first insulating layer 110 may include, for example, a PID material.

The top surface 516u of the portion of the second barrier layer 516 on the sacrificial layer 514 may exposed by, for example, photolithography.

Figure 9:
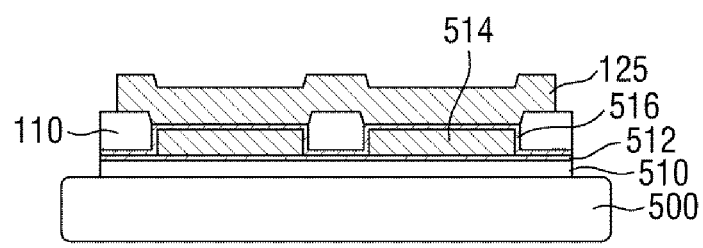

Referring to FIG. 9, a first redistribution layer 125 may be formed on the first insulating layer 110 and on the top surface 516u of the part of the second barrier layer 516 on the sacrificial layer 514.

The first redistribution layer 125 may include the same material as the sacrificial layer 514. For example, the first redistribution layer 125 may include Cu.

Figure 10:
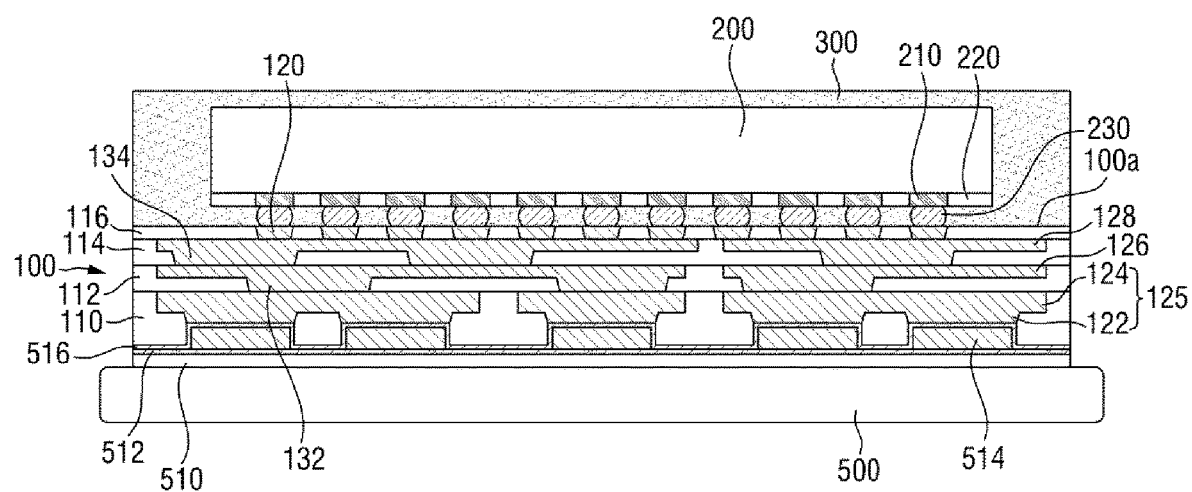

Referring to FIG. 10, a redistribution structure 100 including the first redistribution layer 125 may be formed. For example, a plurality of vias (132 and 134) and a plurality of redistribution layers (120, 126, and 128) may be formed by electroplating. For example, a first via 132 and a second redistribution layer 126 may be formed at the same time by a damascene process. In some embodiment, the first via 132 and the second redistribution layer 126 may be formed by the same process (e.g., a damascene process).

Thereafter, a semiconductor chip 200 may be mounted on the first surface 100a of the redistribution structure 100. Connection pads 210 of the semiconductor chip 200 and bumps 230, which are disposed on the connection pads 210, may be disposed on a redistribution layer 120.

Thereafter, a molding part 300 may be formed to cover the semiconductor chip 200 and the first surface 100a of the redistribution structure 100.

Figure 11:
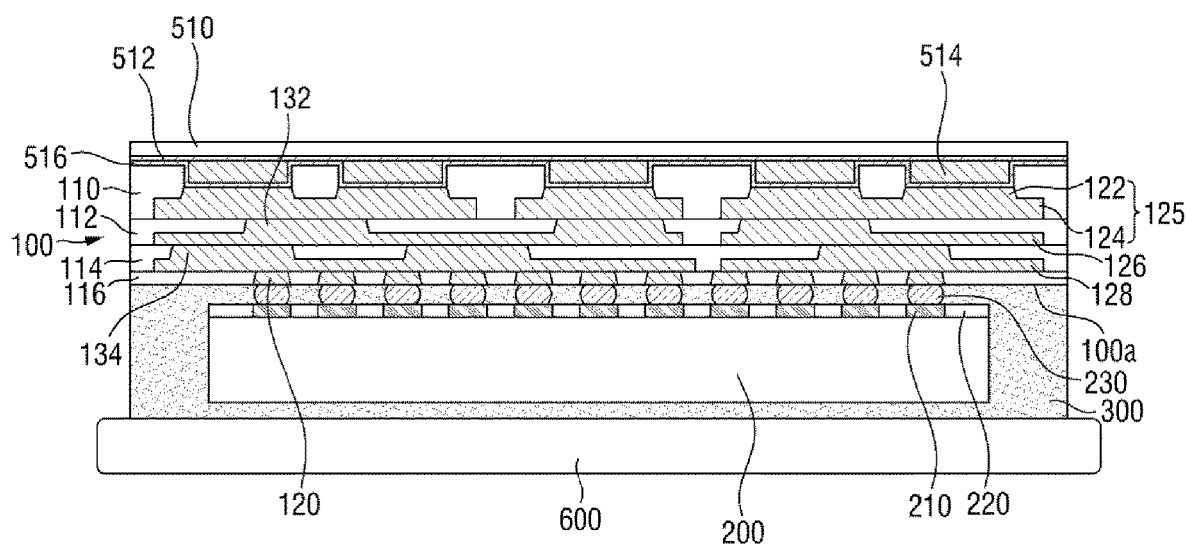

Referring to FIG. 11, a second carrier 600 may be attached on the molding part 300. The second carrier 600 may be disposed on a surface that faces the first carrier 500. For example, an adhesive layer (not illustrated) may be further formed between the second carrier 600 and the molding part 300. The adhesive layer may include, for example, an LTHC material that can be removed together with the second carrier 600. In some embodiments, the adhesive layer may include, for example, an epoxy-based heat-release material or a UV adhesive.

The second carrier 600 may include, for example, silicon, a metal, glass, plastics, or ceramics. In some embodiments, the second carrier 600 may include the same material as the first carrier 500.

Thereafter, the corresponding semiconductor package may be turned upside down. Thereafter, the first carrier 500 may be removed from the semiconductor package. As a result, the release layer 510 may be exposed.

Figure 12:
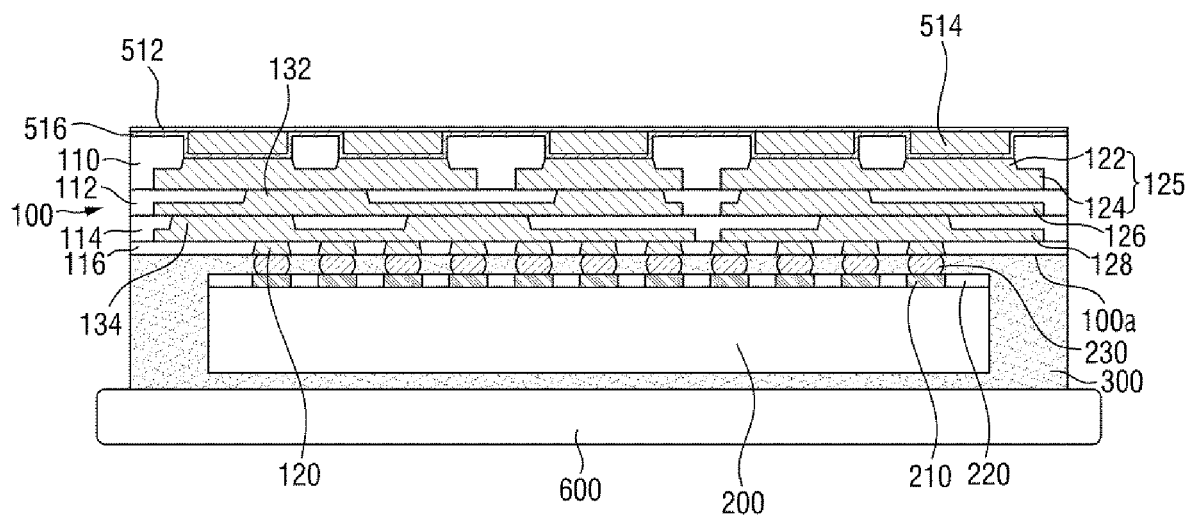

Referring to FIG. 12, the release layer 510 may be removed.

The release layer 510 may be irradiated with light or laser light. Portions of the release layer 510 that is exposed to light may be removed by a mold development process.

Figure 13:
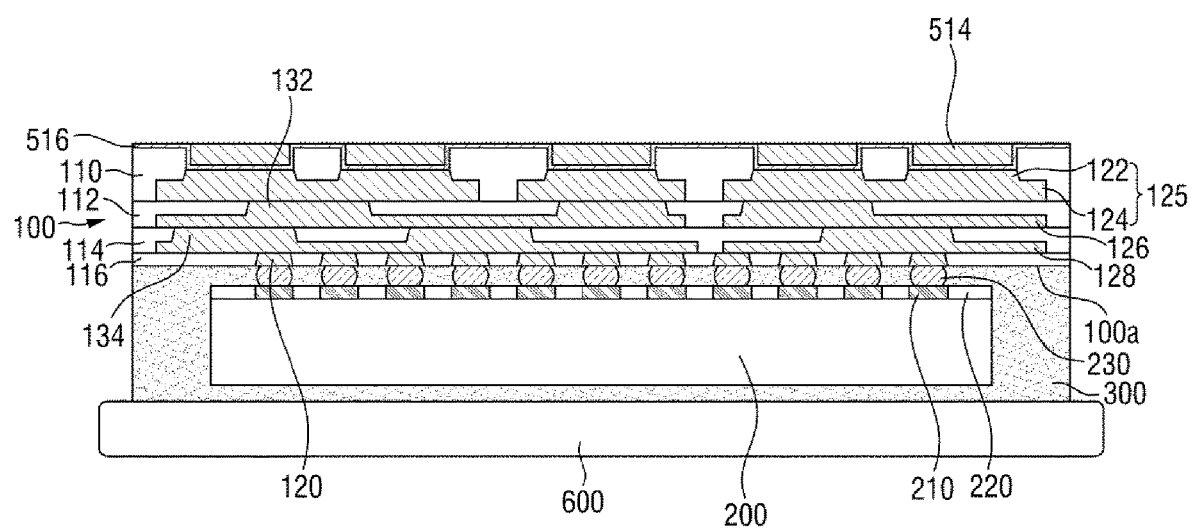

Referring to FIG. 13, the first barrier layer 512 may be removed. The first barrier layer 512 may be removed by, for example, wet etching. In some embodiments, the first barrier layer 512 may be removed by, for example, dry etching.

Figure 14:
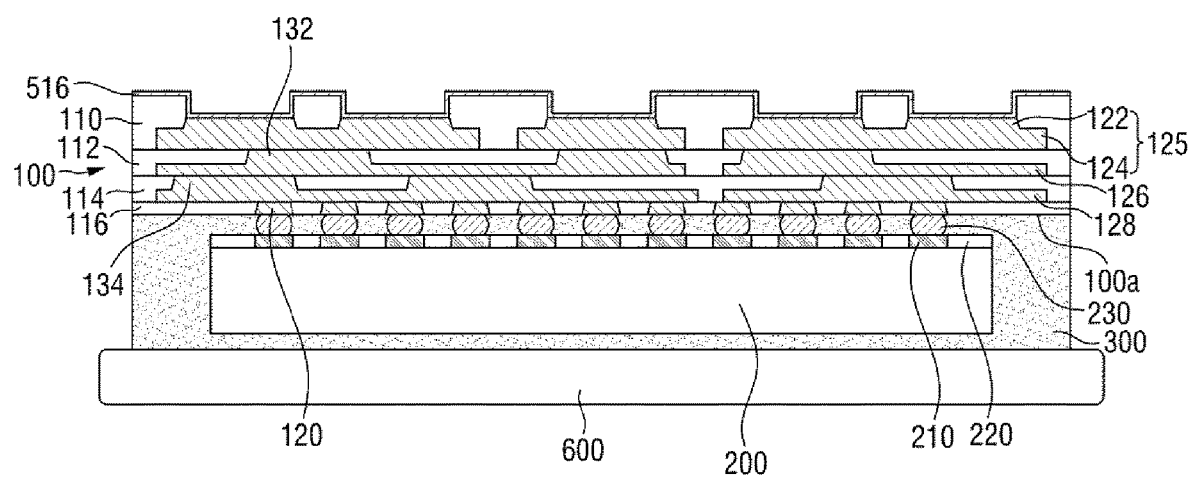

Referring to FIG. 14, the sacrificial layer 514 may be removed. The sacrificial layer 514 may be removed by, for example, wet etching. In some embodiments, the sacrificial layer 514 may be removed by, for example, dry etching.

Figure 15:
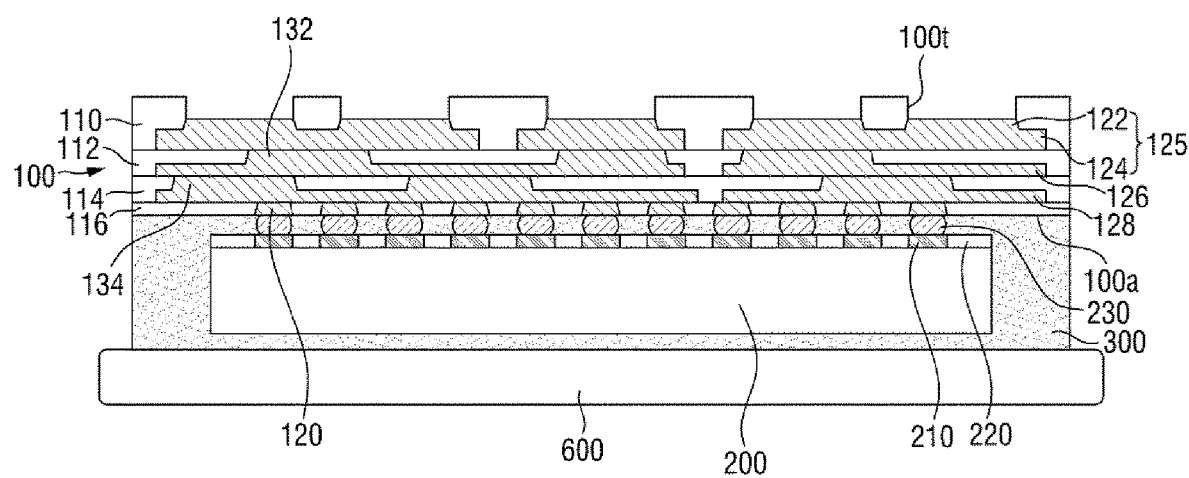

Referring to FIG. 15, the second barrier layer 516 may be removed. As a result, the first redistribution layer 125 may be at least partially exposed. Electrode pads 122 of the first redistribution layer 125 may be exposed. That is, trenches 100t, which are defined by a first insulating layer 110 and the electrode pads 122, may be formed. The trenches 100t may be formed by removing the first barrier layer 512, the second barrier layer 516, and the sacrificial layer 514.

The second barrier layer 516 may be removed by, for example, wet etching. In some embodiments, the second barrier layer 516 may be removed by, for example, dry etching.

Figure 16:
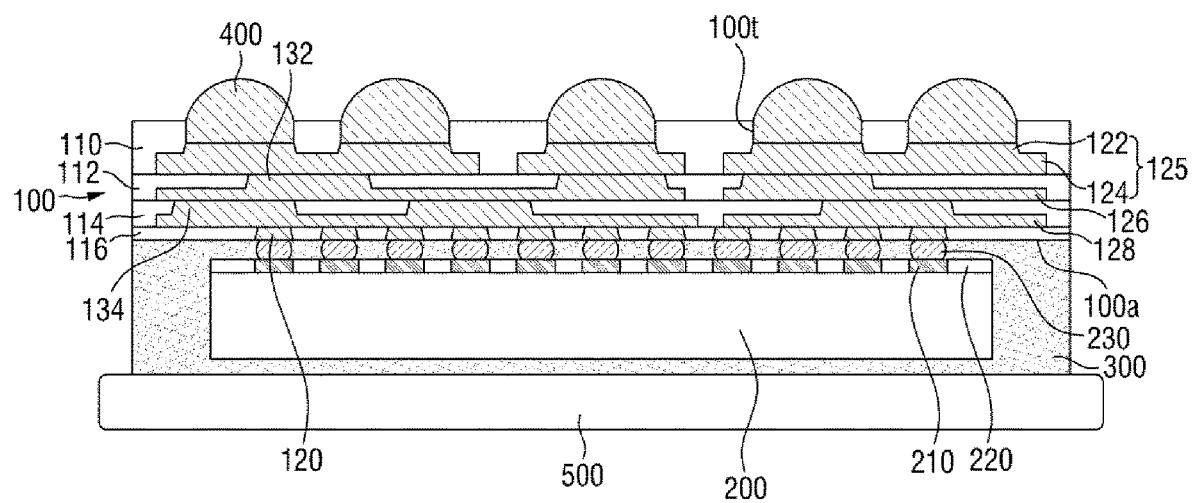

Referring to FIG. 16, solder balls 400 may be formed in the trenches 100t. The solder balls 400 may include portions disposed inside the redistribution structure 100 and portions disposed outside the redistribution structure 100. The first redistribution layer 125 and the solder balls 400 may be at least partially surrounded by the first insulating layer 110. Accordingly, the reliability of the bonding between the solder balls 400 and the electrode pads 122 can be improved.

The solder balls 400 may be formed on exposed parts of the second barrier layer 516. Accordingly, the solder balls 400 may be electrically connected to the redistribution layers (120, 125, 126, and 128).

Figure 17:
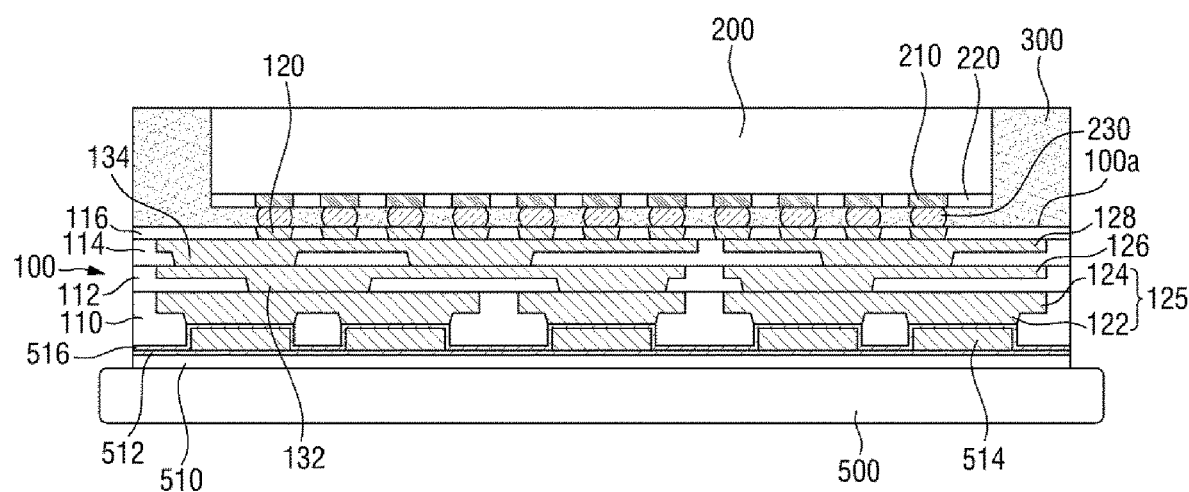
FIGS. 17 and 18 are cross-sectional views illustrating a method of fabricating a semiconductor package according to some embodiment of the present inventive concept.
Figure 18:
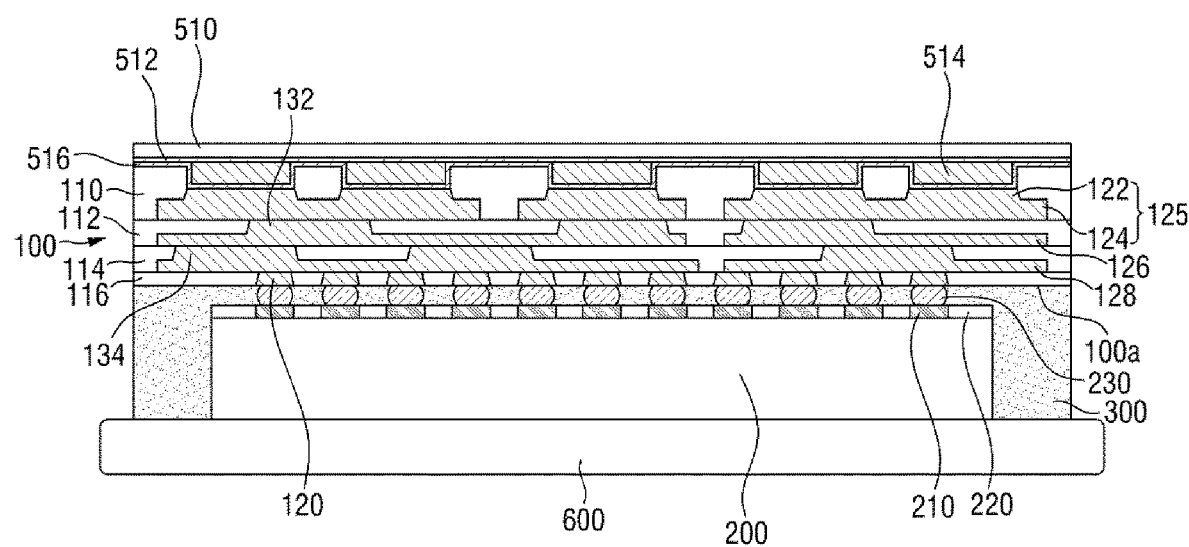

FIGS. 17 and 18 are cross-sectional views illustrating a method of fabricating a semiconductor package according to some embodiment of the present inventive concept. The semiconductor package of FIG. 17 is a semiconductor package formed by processes the same as or similar to those illustrated in FIGS. 4 through 10. A method of fabricating a semiconductor package according to some embodiments of the present inventive concept will hereinafter be described with reference to FIGS. 17 and 18.

Referring to FIG. 17, a molding part 300 may be partially etched by a planarization process. The molding part 300 may expose the top surface of a semiconductor chip 200. That is, the top surface of the molding part 300 may be disposed on the same plane as the top surface of the semiconductor chip 200.

Thereafter, referring to FIG. 18, a second carrier 600 may be attached on the semiconductor chip 200 and on the molding part 300. The second carrier 600 may be disposed on a surface that faces the first carrier 500. For example, an adhesive layer (not illustrated) may be further formed between the second carrier 600, the semiconductor chip 200, and the molding part 300.

Thereafter, the corresponding semiconductor package is turned upside down. The first carrier 500 may be removed from the semiconductor package. As a result, a release layer 510 may be exposed.

Thereafter, processes the same as or similar to those illustrated in FIGS. 13 through 16 may be performed, thereby obtaining the semiconductor package of FIG. 3.

In concluding the detailed description, those skilled in the art will appreciate that many variations and modifications may be made to the example embodiments described herein without departing from the principles of the present inventive concept. Therefore, the example embodiments of the present inventive concept are used in a generic and descriptive sense only and not for purposes of limitation.

What is claimed is:
1. A semiconductor package comprising:
an insulating layer;
a redistribution layer including a first portion and a second portion on the first portion;
a solder ball directly contacting the first portion of the redistribution layer and the insulating layer; and
a semiconductor chip on a top surface of the insulating layer,
wherein a bottom surface of the first portion of the redistribution layer is above a bottom surface of the insulating layer,
a first height from the bottom surface of the insulating layer to the first portion of the redistribution layer is less than a second height from the bottom surface of the insulating layer to the second portion of the redistribution layer,
a width of the first portion of the redistribution layer is less than a width of the second portion of the redistribution layer, and
a top surface of the redistribution layer is coplanar with the top surface of the insulating layer.

2. The semiconductor package of claim 1, wherein the bottom surface of the first portion is disposed in the insulating layer.

3. The semiconductor package of claim 1, wherein the redistribution layer includes copper.

4. The semiconductor package of claim 1, wherein the insulating layer includes a photo-imageable dielectric material.

5. The semiconductor package of claim 1, further comprising:
a molding part covering at least a portion of the semiconductor chip on the top surface of the insulating layer.

6. The semiconductor package of claim 5, wherein a top surface of the molding part is coplanar with a top surface of the semiconductor chip.

7. A semiconductor package comprising:
a redistribution layer including an electrode pad and a sub-redistribution layer on the electrode pad;

an insulating layer on a side surface of the redistribution layer and including a trench on at least a portion of the electrode pad;

a solder ball in the trench and directly contacting the electrode pad and the insulating layer; and a semiconductor chip on the redistribution layer, wherein a bottom surface of the electrode pad faces the solder ball, and the solder ball has a width that is the same as a width of the bottom surface of the electrode pad;

wherein the electrode pad and the sub-redistribution layer have an integral structure, and a top surface of the redistribution layer is coplanar with a top surface of the insulating layer;

wherein each of the electrode pad and the sub-redistribution layer extend along a first direction; and wherein a first width of the electrode pad is less than a second width of the sub-redistribution layer.

8. The semiconductor package of claim 7, wherein the electrode pad is on a portion of the sub-redistribution layer with the first width.

9. The semiconductor package of claim 7, wherein the first width increases from the solder ball to the sub-redistribution layer.

10. The semiconductor package of claim 7, wherein a first height from a bottom surface of the insulating layer to the electrode pad is less than a second height from the bottom surface of the insulating layer to the sub-redistribution layer.

11. The semiconductor package of claim 7, wherein the electrode pad entirely overlaps the sub-redistribution layer.

12. A semiconductor package comprising:
a redistribution structure including a first insulating layer, a first redistribution layer in the first insulating layer, a second insulating layer on the first insulating layer, and a second redistribution layer electrically connected to the first redistribution layer in the second insulating layer, wherein each of the first redistribution layer and second redistribution layer includes a first portion having a first width and a second portion having a second width greater than the first width on the first portion;

a semiconductor chip on the redistribution structure;

a bump between the redistribution structure and the semiconductor chip;

a solder ball contacting the first insulating layer and the first portion of the first redistribution layer; and a molding part covering at least a portion of the semiconductor chip on the redistribution structure, wherein a first height from a bottom surface of the first insulating layer to the first portion of the first redistribution layer is less than a second height from the bottom surface of the first insulating layer to the second portion of the first redistribution layer, a width of the first portion of the first redistribution layer is less than a width of the second portion of the first redistribution layer, and a top surface of the first redistribution layer is coplanar with a top surface of the first insulating layer.

13. The semiconductor package of claim 12, wherein the first redistribution layer includes a same material as the second redistribution layer.

14. The semiconductor package of claim 12, wherein the first insulating layer includes a same material as the second insulating layer.

15. The semiconductor package of claim 12, wherein a top surface of the molding part is coplanar with a top surface of the semiconductor chip.

16. The semiconductor package of claim 12, wherein the first width of each of the first and the second redistribution layers increases from a bottom surface of the redistribution structure to a top surface of the redistribution structure.

* * * * *